(12) United States Patent
De Souza et al.

(10) Patent No.: US 7,749,869 B2
(45) Date of Patent: Jul. 6, 2010

(54) CRYSTALLINE SILICON SUBSTRATES WITH IMPROVED MINORITY CARRIER LIFETIME INCLUDING A METHOD OF ANNEALING AND REMOVING SIOX PRECIPITATES AND GETTERNING SITES

(75) Inventors: Joel P. De Souza, Putnam Valley, NY (US); Harold John Hovel, Katonah, NY (US); Daniel A. Inns, White Plains, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/186,243

(22) Filed: Aug. 5, 2008

(65) Prior Publication Data

US 2010/0035409 A1    Feb. 11, 2010

(51) Int. Cl.
*H01L 21/322* (2006.01)
*H01L 21/302* (2006.01)
*H01L 21/461* (2006.01)

(52) U.S. Cl. .................. 438/471; 438/473; 438/690
(58) Field of Classification Search .............. 438/471, 438/473, 690; 257/E21.318
See application file for complete search history.

(56) References Cited

U.S. PATENT DOCUMENTS

| 4,231,809 | A  | * | 11/1980 | Schmidt ............... 438/477 |
| 4,891,325 | A  |   | 1/1990  | Hezel et al. |
| 5,855,735 | A  | * | 1/1999  | Takada et al. ............ 438/691 |
| 6,375,194 | B1 | * | 4/2002  | Peng ..................... 277/314 |
| 6,830,740 | B2 |   | 12/2004 | Oki et al. |
| H2207     | H  |   | 12/2007 | Bijker |
| 2005/0176218 | A1 |   | 8/2005  | Jonczyk et al. |
| 2008/0014661 | A1 |   | 1/2008  | Haag et al. |
| 2008/0157241 | A1 |   | 7/2008  | Kirscht et al. |

* cited by examiner

*Primary Examiner*—William M. Brewster
(74) *Attorney, Agent, or Firm*—Scully, Scott, Murphy & Presser, P.C.; Louis J. Percello, Esq.

(57) ABSTRACT

A method for improving the minority lifetime of silicon containing wafer having metallic contaminants therein is described incorporating annealing at 1200° C. or greater and providing a gaseous ambient of oxygen, an inert gas and a chlorine containing gas such as HCl.

9 Claims, 2 Drawing Sheets

CRYSTALLINE SILICON SUBSTRATES WITH IMPROVED MINORITY CARRIER LIFETIME INCLUDING A METHOD OF ANNEALING AND REMOVING SIOX PRECIPITATES AND GETTERING SITES

FIELD OF THE INVENTION

The present invention relates to improving the minority carrier lifetime of silicon containing substrates or wafers and more particularly to removing metal impurities and SiOx precipitates from scrapped substrates that may have contained MOS FETs for reuse, for example, for fabricating solar cells.

BACKGROUND OF THE INVENTION

A major drawback that prevents the large spread use of solar cells is the cost of photovoltaic material, which is presently about 40% to 50% of the final product. There are several approaches that have been tried to minimize the cost of photovoltaic material. The large majority of these approaches are directed to reducing the price of the material by reducing the amount of material used in the solar cell. In other words, fabricate a solar cell on a thin silicon film. The thin silicon films are deposited on top of glasses or on other low cost material, which limit the processing to a low temperature range (<900° C.). Consequently, new fabrication technologies have still to be developed to increase the solar cell efficiency with lower cost silicon material. The efficiencies of thin silicon film solar cells are typically less than 13% and are usually considerably lower than the efficiency of solar grade silicon wafers which are 17% to 22% efficient.

If the starting material comprises scrapped silicon wafers from an MOS FET production line, the wafers have a cost which is just of a few percent of the cost of solar grade Si wafers. Because of the low minority carrier lifetime (<few microseconds) of scrapped silicon wafers, the solar efficiency for photovoltaic conversion of a cell made with this silicon material is less than 14% efficient.

SUMMARY OF THE INVENTION

In accordance with the present invention, a method for improving the minority carrier lifetime of a silicon containing substrate or semiconductor wafer having metallic contaminants therein comprises annealing the wafer at a temperature in the range from about 1200° C. to about 1375° C. in a gaseous ambient of oxygen, an inert gas and a chlorine containing gas such as HCl for a time period in the range from about 1 minute to about 50 hours whereby the metallic contaminants form volatile metal chlorides and evaporate from the wafer. Concurrently, an oxide layer may be formed on the surface of the silicon containing substrate or semiconductor wafer.

The invention further provides annealing as described above at a temperature at or above 1200° C. to improve lifetime which may be the result of dissolved SiOx precipitates, metal and other contaminant gettering, and other crystallographic or point defect migration related phenomena.

The invention further provides selecting a scrapped silicon wafer having MOS FETs thereon, removing the MOS FETs from the wafer, etching away damaged upper portions of the wafer and cleaning the upper surface of the silicon containing wafer with an RCA clean well known in the art or an equivalent cleaning process followed by annealing as described above.

The invention therefore provides a process to improve the minority carrier lifetime in scrapped silicon containing substrates or semiconductor wafers up to a level comparable to that of solar grade material. The treated scrapped wafers can then be used for fabricating solar cells with efficiencies similar to those of solar grade silicon.

BRIEF DESCRIPTION OF THE DRAWING

These and other features, objects, and advantages of the present invention will become apparent upon consideration of the following detailed description of the invention when read in conjunction with the drawing in which.

DETAILED DESCRIPTION OF THE INVENTION

Figure 1:
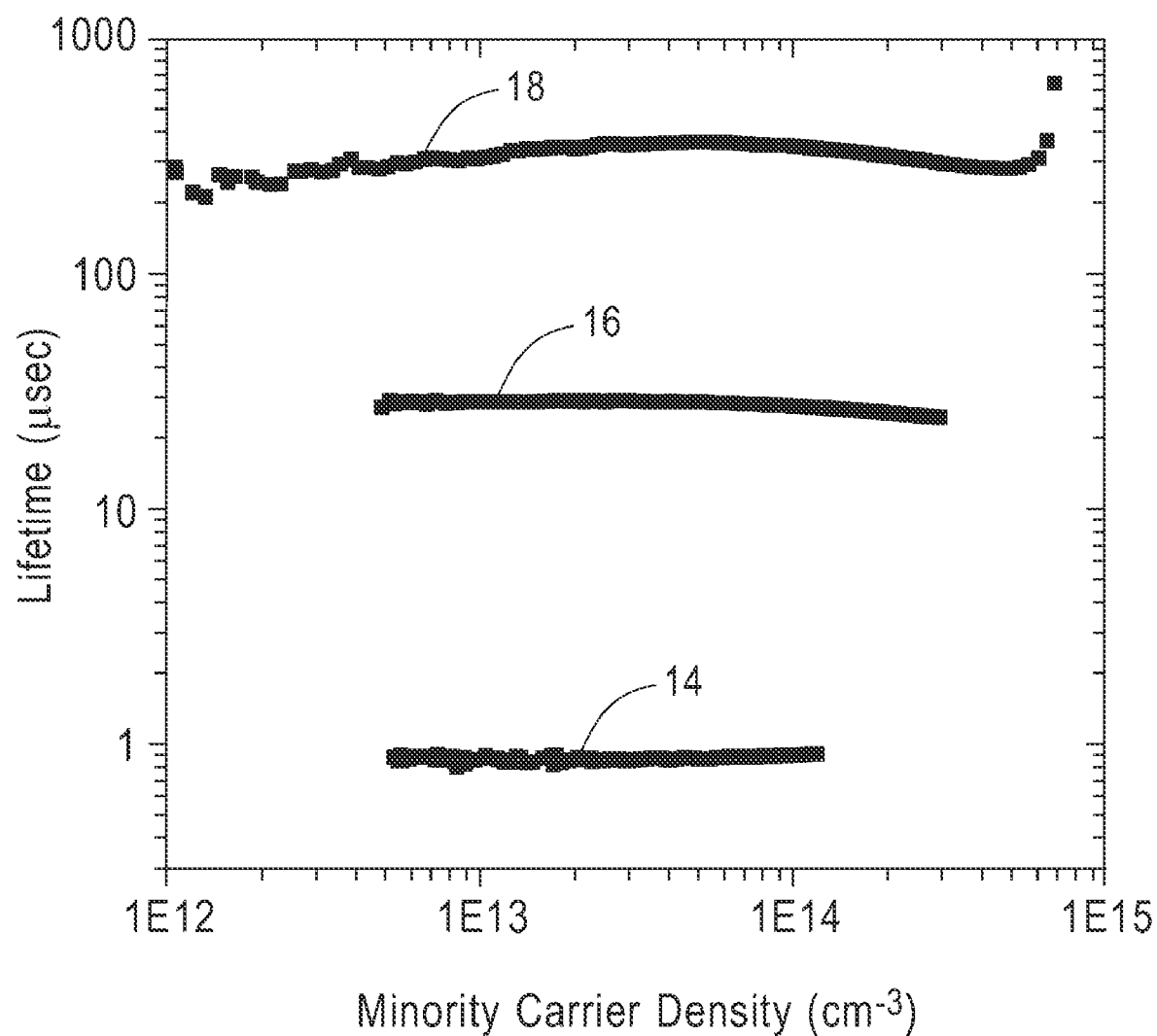
FIG. 1 is a graph showing the typical minority carrier lifetime of a scrapped or recycled wafer after various stages of processing.

In order to increase the lifetime in scrapped Si containing wafers, the upper portion of the wafer is removed which may contain doped regions, MOS FETs and/or bipolar transistors and interconnection wiring. The scrapped wafers may be single crystalline, poly crystalline or Silicon-on-Insulator (SOI) and have a minority carrier lifetime less than 10 microseconds. The scrapped wafers may be semiconductor wafers selected from the group consisting of CMOS grade Si wafers, Si scrapped wafers from CMOS processing, solar grade single crystal Si wafers, solar grade multi-crystalline Si wafers and other types of defective Si wafers having crystallographic defects comprising one or more of twins, stacking faults, point defects, dislocations, precipitates and oxygen interstitial defects. A chemical etch may be performed on the upper surface of the Si containing wafer to remove several micrometers such as 0.01 micrometers to 30 micrometers and preferably about 20 micrometers which may contain damaged material from sanding abrasions in the top surface due to sand blasting during removal of the doped regions, MOS FETs and/or bipolar transistors and interconnection wiring.

Prior to annealing, the upper surface of the silicon containing wafer may be cleaned with an RCA clean wet process well known in the art or an equivalent cleaning wet process to remove surface contaminants.

Metal contamination in the silicon containing wafer which is a minority lifetime killer is removed through high temperature annealing in the range from 1200° C. to 1375° C. and preferably about 1325° C. in an oxygen atmosphere having a controlled amount of a chlorine containing gas such as HCl. An inert gas may be added to oxygen and HCl. During the anneal, the metallic contaminants react primarily at the silicon containing surface with a chlorine containing gas such as HCl and form volatile metal chlorides which exit the wafer into the gaseous ambient or furnace atmosphere. The annealing time period may be in the range from about 1 minute to about 50 hrs and preferably about 10 hrs. In addition, $SiO_x$ precipitates in the silicon containing wafers contribute to reduce the minority carrier lifetime and are effectively dissolved during the thermal annealing.

The minority carrier lifetime improvement in silicon wafers was demonstrated by a process comprising:

chemical etching away the top 20 micrometers of the wafer to remove mechanical damaged followed by a thermal annealing at 1325° C. for 10 hrs in a gas flux or atmosphere composed by 4.7% oxygen by volume diluted in argon and added with 0.075% nitrogen by volume saturated with 1,1,1-trichloroethane vapor at 20° C. to provide HCl.

The gas volume percentages in the gaseous ambient are determined by the gas flow into the annealing furnace. For an oxygen flow of 2 l/min into the annealing furnace, it is necessary to have a HCl flux of 20 cc/min, or 6.66 cc/min of TCA to get a furnace atmosphere with 1% HCl. The $N_2$ carrier gas flow is calculated to carry the 6.66 cc/min of TCA based on the vapor pressure of TCA at a specific TCA temperature.

For the above process, inert gases may be selected from the group consisting of $N_2$, He, Ne, Ar, Kr, Xe and combinations thereof. Chlorine containing gases or chlorine containing chemical products including liquids may be selected from the group consisting of TCA also know as trichloroethane, 1,1,1 trichloroethane or C33, Trans LC also known as $C_2H_2Cl_2$ or 1,2-trans-dichloroethylene, TCE also know as trichloroethene, HCl, $Cl_2$, $CCl_4$, equivalent chemicals and combinations thereof. A chlorine containing gas or vapor may be saturated in nitrogen by bubbling nitrogen through a chlorine containing liquid such as 1,1,1-trichloroethane.

The ratio by volume of the oxygen to inert gas in the gaseous ambient may be in the range from about 1% to 100%.

The concentration ratio by volume of a chlorine containing gas such as HCl to oxygen in the gaseous ambient may be in the range from about 0.1% to about 5%.

FIG. 1 is a graph showing typical minority carrier lifetimes as a function of minority carrier density after the performance of certain processes on scrapped silicon containing wafers. In FIG. 1, the ordinate represents minority carrier lifetime in microseconds and the abscissa represents minority carrier density per centimeter cubed. Curve 14 shows the minority carrier lifetime in an untreated or unprocessed scrapped wafer of about 0.9 microseconds at a minority carrier density of 1E14/cm3.

Curve 16 shows the minority carrier lifetime in a scrapped wafer after thermal annealing at 1325° C. for 10 hr in a gas flux or gaseous ambient composed by 4.7% oxygen diluted in argon and added with a proper flux of nitrogen saturated with 1,1,1-trichloroethane vapor at 20° C. to obtain concentration ratio by volume of TCA/$O_2$ of 0.33%. The reaction of TCA with oxygen at high temperature yields three times higher concentration by volume of HCl, and hence a HCl/$O_2$ concentration ratio by volume of 1% is expected to be established in the gaseous ambient or furnace atmosphere. The minority carrier lifetime after thermal annealing was about 30 microseconds at a minority carrier density of 1E14/cm3.

Curve 18 shows the minority carrier lifetime in a silicon wafer after being chemically etched by etching away the top 20 micrometers of the wafer to remove mechanical damage due to sand blasting the top surface and thermal annealing at 1325° C. for 10 hrs in a gas flux or gaseous ambient comprising 4.7% oxygen by volume diluted in argon and added with proper flux of nitrogen saturated with 1,1,1-Trichloroethane vapor at 20° C. to obtain a concentration ratio by volume of HCl to $O_2$ of 1%. The minority carrier lifetime after etching and thermal annealing was about 360 microseconds at a minority carrier density of 1E14/cm3.

The minority carrier lifetime improvements carried out just by the annealing as shown by curve 16 is noticeable (about 33x) over curve 14 at a minority carrier density of 1E14/cm3. However, in the case where the wafer surface was etched and then annealed as shown by curve 18, the minority carrier lifetime improvement is outstanding (about 400x) over curve 14 at a minority carrier density of 1E14/cm3. The combination of an etch to remove mechanical damage and a high temperature annealing according to above described parameters converts the very low cost scrapped silicon containing wafers to a silicon containing material comparable to solar grade material.

Figure 2:
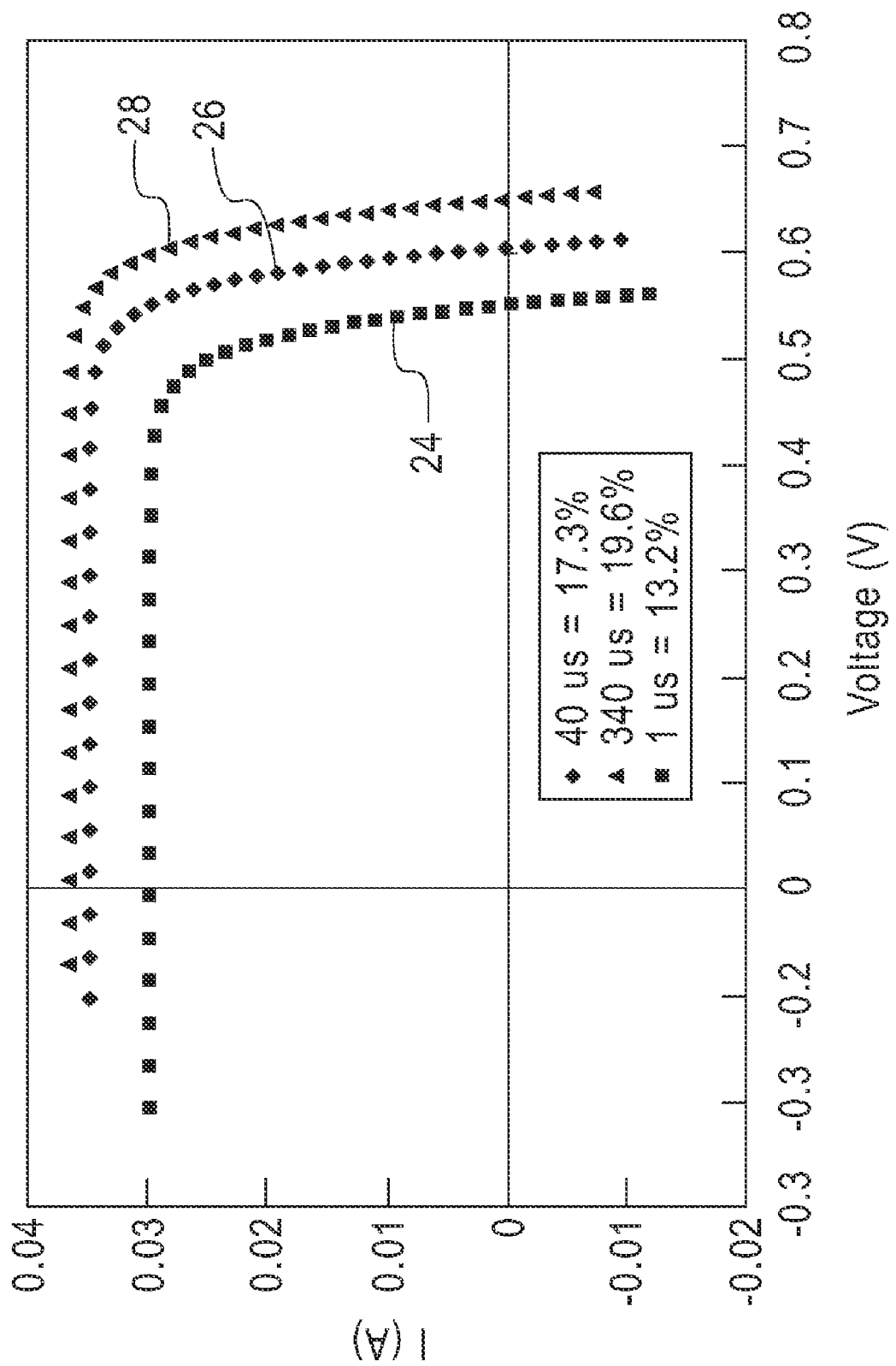
FIG. 2 is a graph showing the expected calculated efficiencies of a solar cell fabricated with Si wafers having various minority carrier lifetimes.

FIG. 2 is a graph showing expected efficiencies of a pn junction solar cell fabricated with a silicon wafer with various minority carrier lifetimes. In FIG. 2, the ordinate represents current in amperes and the abscissa represents voltage in volts. In FIG. 2, the expected performance or efficiency of a pn junction solar cell is shown where respective solar cells are fabricated on three materials with different minority carrier lifetimes. The different minority carrier lifetimes correspond to respective silicon containing wafers processed as described for curves 14, 16 and 18, respectively. It is noted that the minority carrier lifetimes selected for use in the calculations for FIG. 2 vary somewhat from the measured minority carrier lifetimes plotted in FIG. 1.

FIG. 2 shows an I/V curve 24 for a solar cell made in material with a minority carrier lifetime of 1 microsecond corresponding to the process described for curve 14 in FIG. 1. Curve 24 corresponds to a solar cell efficiency of 13.2%. FIG. 2 shows an I/V curve 26 for a solar cell made in material with a minority carrier lifetime of 40 microseconds corresponding to the process described for curve 16 in FIG. 1. Curve 26 corresponds to a solar cell efficiency of 17.3%. FIG. 2 shows an I/V curve 28 for a solar cell made in material with a minority carrier lifetime of 340 microseconds corresponding to the process described for curve 18 in FIG. 1. Curve 28 corresponds to a solar cell efficiency of 19.6%.

While there has been described and illustrated a process for increasing or improving the minority carrier lifetime of silicon containing material due to metal contaminants by annealing in a gaseous ambient of oxygen, an inert gas and a chlorine containing gas such as HCl, it will be apparent to those skilled in the art that modifications and variations are possible without deviating from the broad scope of the invention which shall be limited solely by the scope of the claims appended hereto.

We claim:

1. A method for improving the minority carrier lifetime of a scrapped semiconductor wafer having contaminants including metallics therein comprising:

selecting a scrapped semiconductor wafer having a bare upper surface and a bare lower surface, said scrapped semiconductor wafer comprises a previously processed semiconductor wafer that is now void of any doped region and any semiconductor device; and annealing said scrapped semiconductor wafer at a temperature in the range from about 1200° C. to about 1375° C. in a gaseous ambient of oxygen, an inert gas and a chlorine containing gas for a time period from about 1 minute to about 50 hrs whereby said contaminants form volatile metal chlorides and evaporate from the wafer and wherein SiOx precipitates and gettering sites within the scrapped semiconductor wafer are removed during said annealing to enhance minority carrier lifetime within the scrapped semiconductor wafer.

2. The method of claim 1 wherein said scrapped semiconductor wafer is selected from the group consisting of CMOS grade Si wafers, Silicon-on-Insulator (SOI) wafers, Si scrapped wafers from CMOS processing, solar grade single crystal Si wafers, solar grade multi-crystalline Si wafers and other types of Si containing wafers having crystallographic defects comprising one or more of twins, stacking faults, point defects, dislocations, precipitates and oxygen interstitial defects.

3. The method of claim 1 wherein said oxygen is about 4.7% by volume of said gaseous ambient.

4. The method of claim 1 wherein a ratio by volume of said oxygen to inert gas in said gaseous ambient is in the range from about 1% to 100%.

5. The method of claim 1 wherein said chlorine containing gas is HCl.

6. The method of claim 5 where in said HCl is provided by about 0.075% nitrogen by volume saturated with 1,1,1-trichloroethane vapor at 20° C.

7. The method of claim 1 wherein a concentration ratio by volume of said chlorine containing gas to oxygen in said gaseous ambient is in the range from about 0.1% to about 5%.

8. The method of claim 1 further including annealing at a temperature at or above 1325° C.

9. The method of claim 1 wherein said annealing is performed at a temperature at or above 1325° C. to enhance dissolution of said SiOx precipitates, and said gettering sites to the surface.

* * * * *